US011017856B1

(12) United States Patent
Kamalanathan et al.

(10) Patent No.: US 11,017,856 B1
(45) Date of Patent: May 25, 2021

(54) SOFT RESET FOR MULTI-LEVEL PROGRAMMING OF MEMORY CELLS IN NON-VON NEUMANN ARCHITECTURES

(71) Applicant: Applied Materials, Inc., Santa Clara, CA (US)

(72) Inventors: Deepak Kamalanathan, San Jose, CA (US); Siddarth Krishnan, San Jose, CA (US); Archana Kumar, Mountain View, CA (US); Fuxi Cai, Sunnyvale, CA (US); Federico Nardi, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/793,794

(22) Filed: Feb. 18, 2020

(51) Int. Cl.
*G11C 11/00* (2006.01)
*G11C 13/00* (2006.01)

(52) U.S. Cl.
CPC ........ *G11C 13/0097* (2013.01); *G11C 13/004* (2013.01); *G11C 13/0038* (2013.01); *G11C 13/0069* (2013.01)

(58) Field of Classification Search
CPC . G11C 11/00; G11C 13/0097; G11C 13/0038; G11C 13/004; G11C 13/0069
USPC ................................................. 365/148, 163
See application file for complete search history.

(56) References Cited

U.S. PATENT DOCUMENTS

| 4,228,524 | A | 10/1980 | Neale et al. | |
|---|---|---|---|---|
| 7,697,326 | B2 | 4/2010 | Sommer et al. | |
| 8,174,905 | B2 | 5/2012 | Shalvi et al. | |
| 8,429,493 | B2 | 4/2013 | Sokolov et al. | |
| 8,644,061 | B2 | 2/2014 | Hwang et al. | |
| 9,959,928 | B1 | 5/2018 | Hsu et al. | |
| 2009/0040816 | A1 | 2/2009 | Kang et al. | |
| 2012/0236624 | A1 | 9/2012 | Costa et al. | |
| 2015/0243353 | A1 | 8/2015 | Lee et al. | |
| 2016/0148678 | A1 | 5/2016 | Park et al. | |
| 2017/0207272 | A1* | 7/2017 | Takashi Ma | .......... H01L 45/146 |
| 2018/0267724 | A1* | 9/2018 | Jang | ........................ G06F 13/16 |

* cited by examiner

*Primary Examiner* — Harry W Byrne
(74) *Attorney, Agent, or Firm* — Kilpatrick Townsend & Stockton LLP

(57) ABSTRACT

A method for setting memory elements in a plurality of states includes applying a set signal to a memory element to transition the memory element from a low-current state to a high-current state; applying a partial reset signal to the memory element to transition the memory element from the high-current state to a state between the high-current state and the low-current state; determining whether the state corresponds to a predetermined state; and applying one or more additional partial reset signals to the memory element until the state corresponds to the predetermined current state. The memory element may be coupled in series with a transistor, and a voltage control circuit may apply voltages to the transistor to set and partially reset the memory element.

11 Claims, 13 Drawing Sheets

SOFT RESET FOR MULTI-LEVEL PROGRAMMING OF MEMORY CELLS IN NON-VON NEUMANN ARCHITECTURES

BACKGROUND

A resistive random-access memory (ReRAM) is a type of nonvolatile random-access memory (RAM) that operates by changing resistance across a dielectric solid-state material. A ReRAM device is often arranged with a control transistor in a 1 transistor-1 resistor (1T1R) memory cell architecture. These memory cells may be used in many different applications, including traditional Von Neumann architectures. A Von Neumann architecture is a computer architecture that includes a processing unit with an arithmetic logic unit and processor registers, a control unit with an instruction register and a program counter, memories that store data and instructions, and/or input/output mechanisms. When a 1T1R memory cell is used in a computer architecture, a filament may be formed between a pair of metal electrodes that causes the memory element to conduct in a relatively high-current state to represent a logic 1 value. This filament may be formed by generating a positive voltage pulse across the drain and source of the transistor. To reset the memory element, a negative voltage pulse may be applied to dissipate the filament and represent a logic 0 value.

SUMMARY

In some embodiments, a method for setting memory elements in a plurality of states may include applying a set signal to a memory element to transition the memory element from a low-current state to a high-current state; applying a partial reset signal to the memory element to transition the memory element from the high-current state to a state between the high-current state and the low-current state; determining whether the state corresponds to a predetermined state; and applying one or more additional partial reset signals to the memory element until the state corresponds to the predetermined current state.

In some embodiments, a memory cell may include a memory element, a transistor in series with the memory element, and a voltage control circuit. The voltage control circuit may be configured to apply one or more first voltage pulses to the transistor to cause the memory element to transition from a low-current state to a high-current state; apply one or more second voltage pulses to the transistor to cause the memory element to transition from the high-current state to a state between the high-current state and the low-current state; determine whether the state corresponds to a predetermined state; and apply one or more additional voltage pulses to the transistor until the state corresponds to the predetermined state.

In some embodiments, a memory cell may include a memory element and a transistor. A first voltage applied to the transistor may cause the memory element to transition from a low-current state to a high-current state; and a second voltage applied to the transistor may cause the memory element to transition from the high-current state to a state between the high-current state and the low-current state.

In any embodiments, any of the following features may be implemented in any combination and without limitation. The low-current state may correspond to a logic 0; and the high-current state may correspond to a logic 1. The memory element may include a filamentary Random Access Memory (RAM). The filamentary RAM may include a resistive RAM (ReRAM). The memory element may be part of a non-Von Neumann architecture. The state may correspond to a current level of less than 1 µA through the memory element. The state may be one of a plurality of intermediate states between the high-current state and the low-current state. The plurality of intermediate states may include at least three intermediate states, each of which may have a non-overlapping current range between 10 nA and 1 µA. Each of the plurality of intermediate states may correspond to a different tunneling barrier length in the memory element. A width of a filament in the memory element may be approximately the same for each of the plurality of intermediate states. Determining whether the state corresponds to the predetermined state may include measuring a current through the memory element; and comparing the current through the memory element to a predetermined current corresponding to the predetermined state. The one or more additional voltage pulses applied to the memory element may include approximately equal voltage pulses. The one or more additional voltage pulses applied to the memory element may include voltage pulses of increasing magnitude. The one or more first voltage pulses may be applied across a drain and a source of the transistor. The one or more first voltage pulses may be applied to a gate of the transistor. The one or more first voltage pulses may correspond to a predetermined starting point for a current level at or above a current level for the state. The second voltage may include a plurality of voltage pulses.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

Figure 1B:
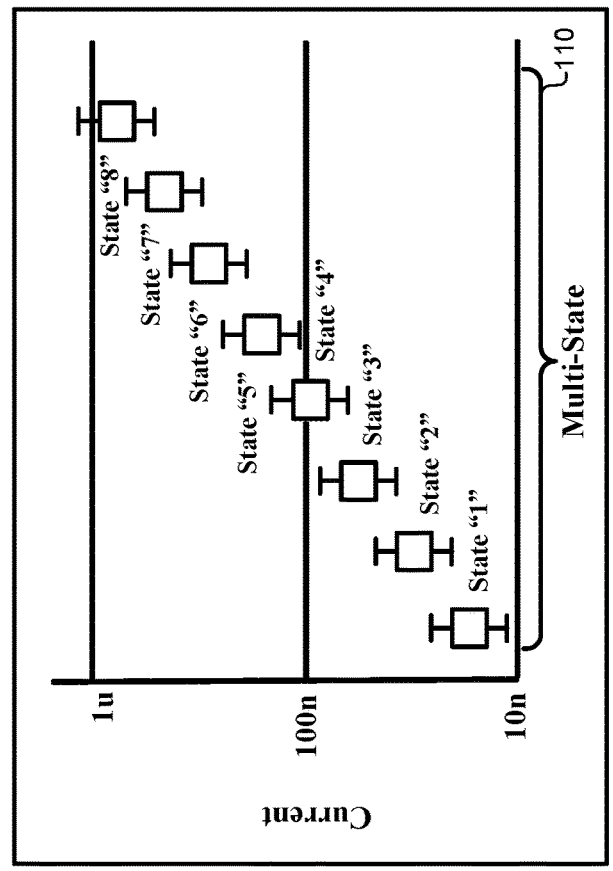
FIG. 1B illustrates a distribution of the plurality of intermediate states in the lower portion of the current range for the memory element, according to some embodiments.

A resistive random-access memory (ReRAM) is a type of nonvolatile random-access memory (RAM) that operates by changing resistance across a dielectric solid-state material. A ReRAM device is often arranged with a control transistor in a 1 transistor-1 resistor (1T1R) memory cell architecture. These memory cells may be used in many different applications, including traditional Von Neumann architectures. A Von Neumann architecture is a computer architecture that includes a processing unit with an arithmetic logic unit and processor registers, a control unit with an instruction register and a program counter, memories that store data and instructions, and/or input/output mechanisms. When a 1T1R memory cell is used in a computer architecture, a filament may be formed between a pair of metal electrodes that causes the memory element to conduct in a relatively high-current state to represent a logic 1 value. This filament may be formed by generating a positive voltage pulse across the drain and source of the transistor. To reset the memory element, a negative voltage pulse may be applied to dissipate the filament and represent a logic 0 value.

For traditional memory applications, such as embedded memories, a standard NOR FLASH memory cell may be sufficient. Each NOR FLASH memory cell can be programmed to two distinct current states generally described as a high-current state and a low-current state. As used herein, the term "low-current state" may refer to a minimum current state to which a memory cell may be set. For example, a low-current state may conduct less than approximately 10 nA of current. Generally, a low-current state may represent a logic 0 (i.e., binary "0"). Similarly, the term "high-current state" may refer to a maximum current state to which a memory cell may be set. For example, a high-current state may conduct more than approximately 10 μA of current. A high-current state may represent a logic 1 (i.e., binary "1"). Existing NOR FLASH technology may operate efficiently when toggling between these two states to represent binary 0 and binary 1, operating on principles of threshold voltage modulation rather than current differences.

While binary memories having two states may be used for traditional Von Neumann architectures, some non-Von Neumann architectures and other applications may benefit from memory cells that can be programmed into a continuum of states between the high-current state and the low-current state. This allows a single memory cell to store a plurality of values in addition to an on/off or I/O value. While some memory cells can be optimized through material and integration advancements to achieve this multi-state behavior, none of the existing memory cells are able to set a plurality of intermediate states in a current-efficient manner.

The embodiments described herein use a ReRAM or other filamentary memory cell to represent multiple states between the low-current state and the high-current state. Instead of changing the materials or configuration of the memory cell, these embodiments instead use programmatic algorithms to reset the memory element into a set of current-efficient intermediate states. These algorithms described herein can be used to store intermediate current levels in applications such as weights in a neural network. For example, some embodiments described herein propose an algorithm that uses a soft-reset or partial reset signals to achieve various intermediate states in a traditional binary ReRAM stack.

Figure 1A:
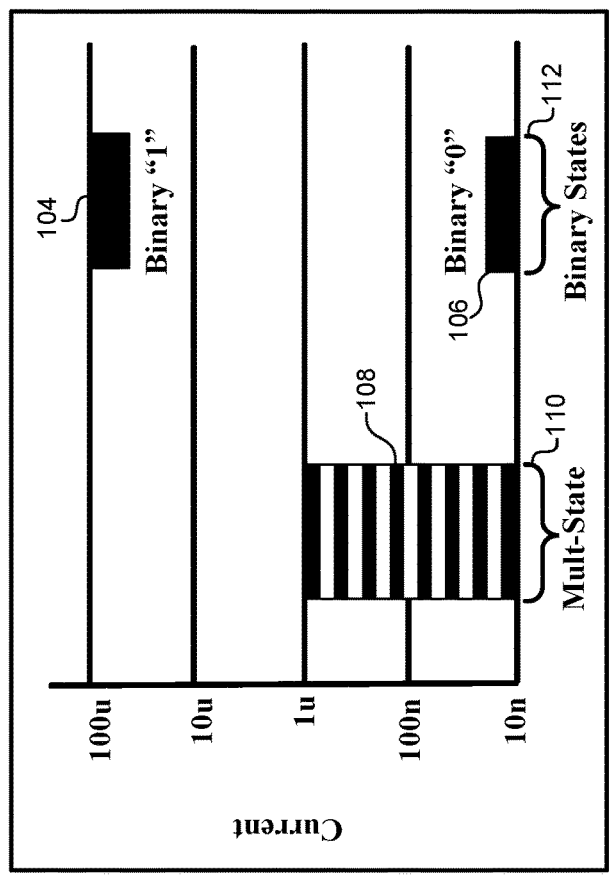
FIG. 1A illustrates a diagram of a current-efficient intermediate states in a memory element, according to some embodiments.

FIG. 1A illustrates a diagram of a current-efficient intermediate states in a memory element, according to some embodiments. The vertical axis illustrates normalized current through the memory element when in the corresponding state using a logarithmic scale. A single memory element may be set to use traditional binary states 112 comprising a high-current state 104 of greater than 10 μA (e.g., around approximately 100 μA representing) a logic 1. The memory element may also be set to a low-current state 106 representing a logic 0. Signals received by a memory cell to enter these states may be generally referred to as set/reset signals. A "set" signal may provide one or more voltage pulses to the memory cell that are sufficient to cause the memory element to enter the high-current state. For example, a set signal may provide a single pulse of sufficient magnitude or a plurality of pulses of a lesser magnitude that cause a filament to form in a ReRAM memory element to fully conduct current and represent a logic 1. Similarly, a "reset" signal may provide one or more voltage pulses to the memory cell that are sufficient to cause the memory element to enter the low-current state. For example, a reset signal may provide a single negative pulse of sufficient magnitude or a plurality of negative pulses of a lesser magnitude to cause a filament to be dissipated from a ReRAM device to prevent current conduction sufficient to enter the low-current state.

In addition to the traditional binary states 112, the embodiments described herein may also allow a memory element to be set in a plurality of intermediate states 108 that are between the high-current state 104 and the low-current state 106. A multistate configuration 110 may receive one or more voltage pulses that cause the memory element to enter a current state that is between the high-current state 104 and the low-current state 106. Note that the plurality of intermediate states 108 need not be equally distributed throughout the entire current range of the memory element. Instead, the plurality of intermediate states 108 may be concentrated in the lower $1/100^{th}$ portion of the current range. This allows the memory element to operate in any of the plurality of intermediate states 108 without drawing a large amount of current. This may be of particular importance in arrays of memory elements, such as crossbar arrays and/or neural networks.

FIG. 1B illustrates a distribution of the plurality of intermediate states 108 in the lower portion of the current range for the memory element, according to some embodiments. In this example, there are eight intermediate states between the low-current state 106 and the high-current state 104. However, the current of the highest of the plurality of intermediate states 108 is less than approximately 1 μA. This is significantly less than the 100 μA that are conducted in the high-current state 104. Therefore, transitioning to even the highest of the plurality of intermediate states 108 can reduce the current usage by approximately 99%. The plurality of states 108 in FIG. 1B may overlap to some extent as allowed by the system controller operating on the chip, and may depend on the application.

Figure 2:
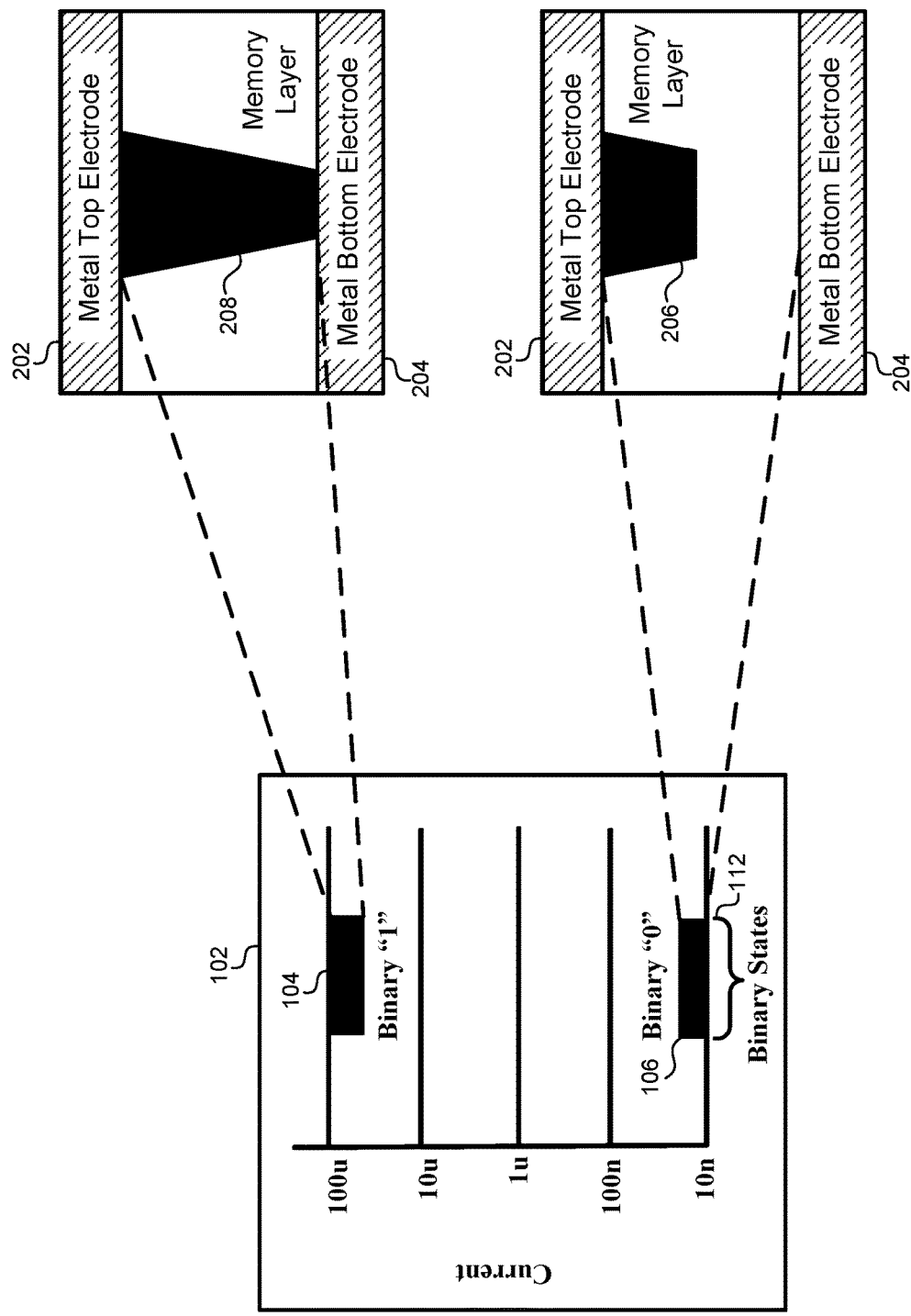
FIG. 2 illustrates how a filament in a ReRAM memory element can be formed or removed to represent the high-current state and the low-current state, according to some embodiments.

FIG. 2 illustrates how a filament in a ReRAM memory element can be formed or removed to represent the high-current state and the low-current state, according to some embodiments. The memory element may include a metal top electrode 202 and a metal bottom electrode 204. A voltage may be applied across the metal top electrode 202 and the metal bottom electrode 204 to cause a filament 208 to form between the metal top electrode 202 and the metal bottom electrode 204. For example, when a positive voltage is applied that is greater than a predetermined "set" voltage for the memory element ($V_{SET}$), a filament may form to bridge an insulating memory layer to electrically connect the metal top electrode 202 to the metal bottom electrode 204 and form a conductive path.

Similarly, when a negative voltage is applied that is greater than a predetermined "reset" voltage for the memory element ($V_{RST}$), the filament may be dissipated such that the conductive path is removed or greatly reduced between the metal top electrode 202 and the metal bottom electrode 204. Note that when the reset signal is received, the width of the filament 206 is largely unaffected. Instead, the portion of the filament between the remaining filament 206 and the bottom metal electrode 204 is dissipated, resulting in a tunneling barrier between the filament 206 and the bottom metal electrode 204. Thus, current may still be conducted through the filament 206 and the tunneling barrier, but the magnitude of this current will be greatly reduced, for example, to approximately 10 nA.

Figure 3:
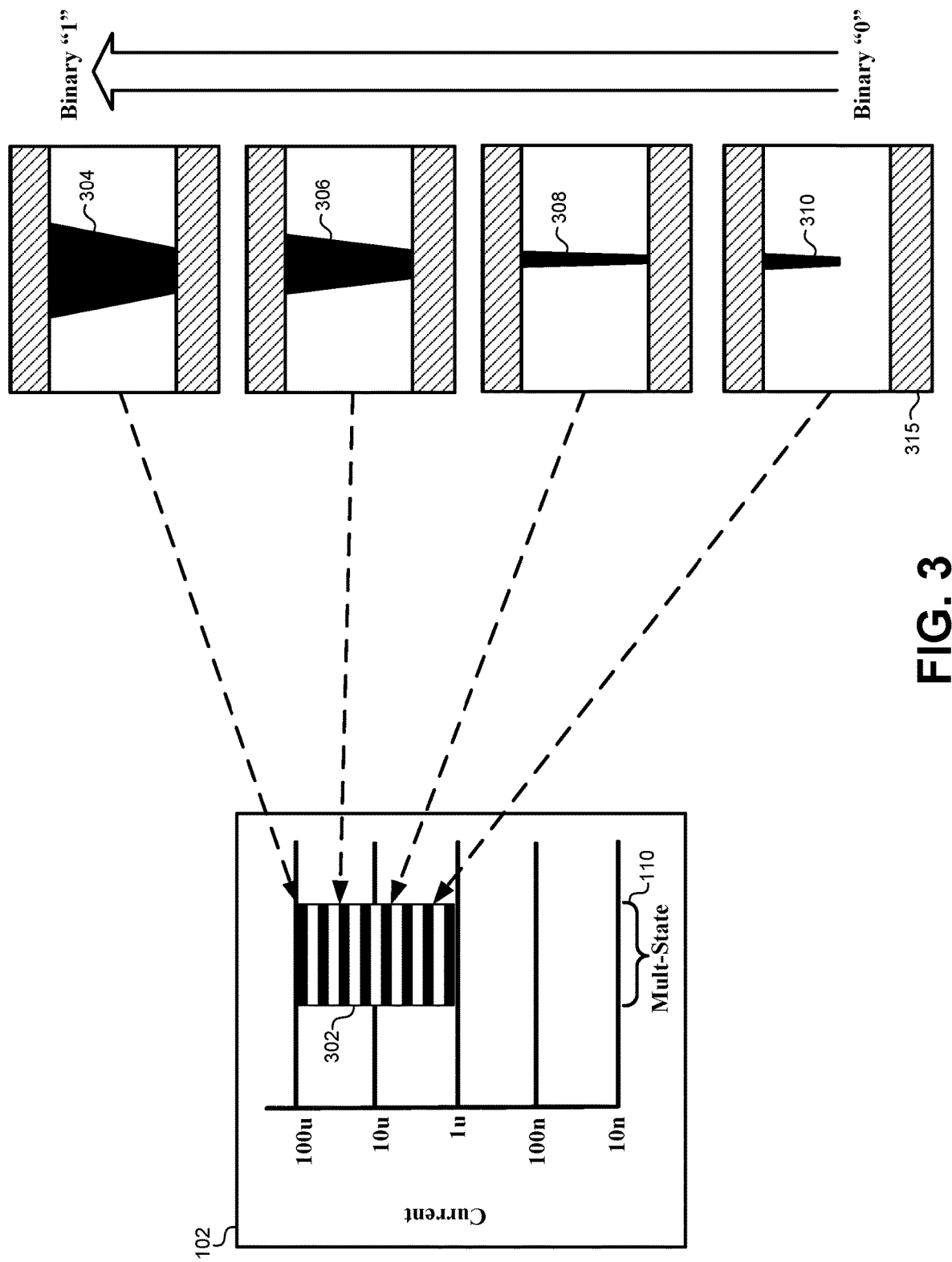
FIG. 3 illustrates how a plurality of intermediate states can be generated using a partial "set" signal, according to some embodiments.

FIG. 3 illustrates how a plurality of intermediate states can be generated using a partial "set" signal, according to some embodiments. As used herein, a "partial set" signal may refer to one or more positive voltage pulses that are provided to the memory element that are not sufficient to fully enter the high-current state. A partial set signal may provide a series of voltage pulses such that each subsequent voltage pulse causes the filament in the memory element to progress in forming between the top/bottom metal electrodes. A partial set signal may refer to a single voltage pulse having a magnitude that is less than the set voltage and/or a plurality of voltage pulses of a lesser magnitude that are not sufficient to cause the filament to fully form.

In this example, a first partial set signal may cause a filament 310 to begin to form between the two electrodes. The filament 310 may be very thin and may still leave a gap between the filament 310 and the bottom electrode 315. This may correspond to an intermediate state that is slightly above 1 µA. A second partial set signal comprising additional positive voltage pulses may cause the filament 308 to fully form between the electrodes and enter an intermediate state such that the memory element conducts approximately 10 µA. A third partial set signal may cause the formed filament 306 to increase in width such that current flows through the filament 306 with less resistance. This may correspond to an intermediate state such that the memory element conducts approximately 50 µA of current. Finally, a sufficient number of partial set signals may be received such that the filament 304 is fully formed and the memory element can enter the high-current state of, for example, approximately 100 µA.

The current measurements described above are provided merely by way of example and are not meant to be limiting. The currents for each of the intermediate states may depend on the materials used in the memory element, the design of the memory element, and the arrangement of memory elements in the overall circuit architecture. Therefore, other current ranges may be used in different embodiments depending on the memory element in light of this disclosure.

Note that the current range for the intermediate states 302 that are enabled by using a partial set signal are all above 1 µA of current. The higher intermediate states in this configuration may draw anywhere between 1 µA and 100 µA. While this may not be problematic for a single memory element, large arrays of memory elements would draw a large amount of current when being set to these intermediate states. This may be particularly true in non-Von Neumann architectures and neural networks where current-per-memory-element needs to be as low as possible for minimizing overall power consumption. Therefore, algorithms relying on providing partial set signals to achieve these intermediate states may not be suitable for low-power applications.

Figure 4:
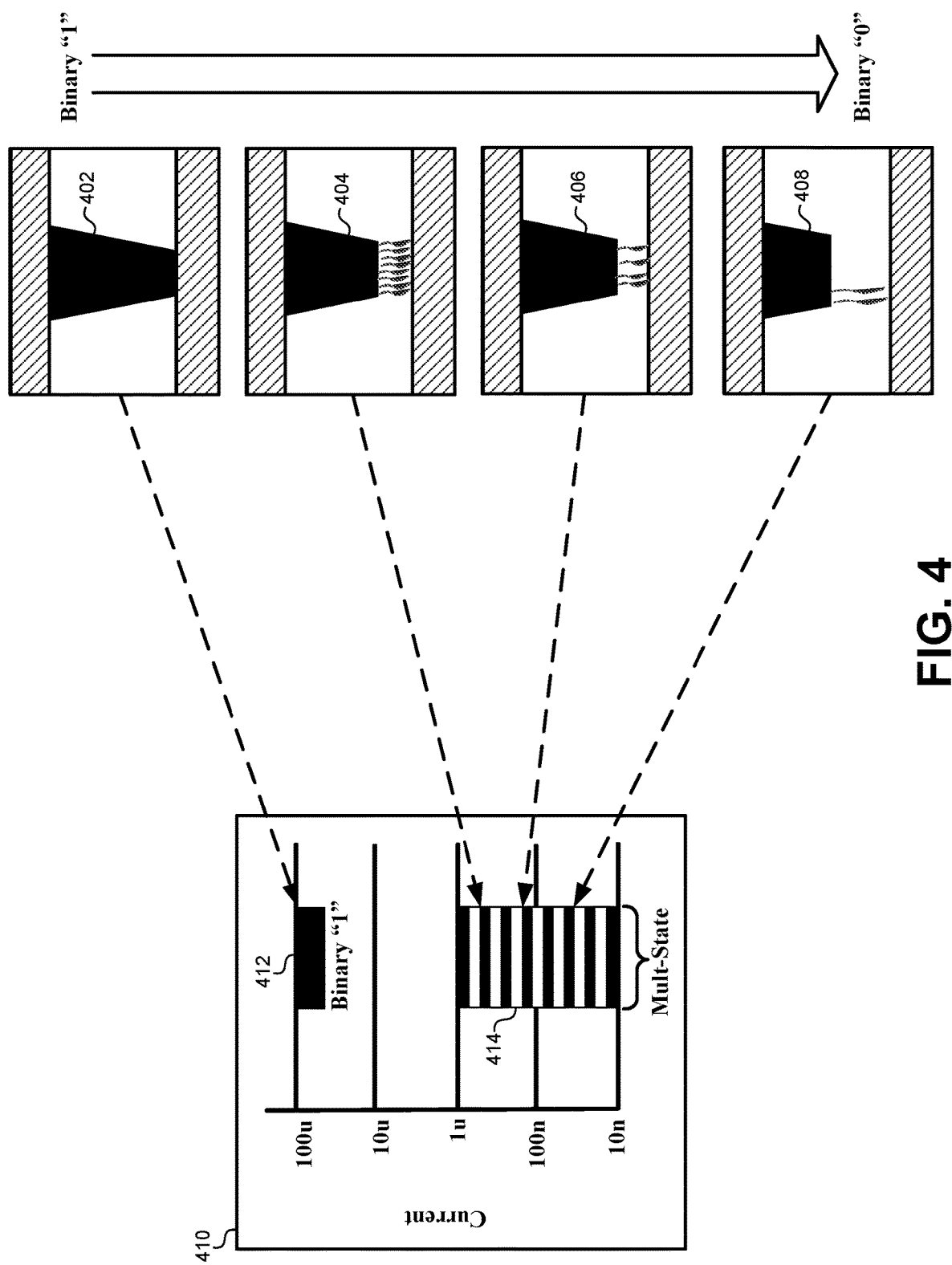
FIG. 4 illustrates how a plurality of intermediate states can be generated using a partial reset signal, according to some embodiments.

FIG. 4 illustrates how a plurality of intermediate states can be generated using a partial reset signal, according to some embodiments. As used herein, a "partial reset" signal may refer to one or more negative voltage pulses that are provided to the memory element that are not sufficient to fully enter the low-current state. A partial reset signal may provide a series of negative voltage pulses such that each subsequent voltage pulse causes the filament in the memory element to progressively dissipate between the metal top/bottom electrodes. A partial reset signal may refer to a single voltage pulse having a magnitude that is less than the reset voltage and/or a plurality of voltage pulses of a lesser magnitude that are not sufficient to cause the filament to fully dissipate.

In this example, the memory element may first be placed in the high-current state 412. This may be accomplished by providing a full set signal to the memory element. For example, one or more pulses of a sufficient magnitude or number may be provided to the memory element to fully form the filament 402 between the top/bottom metal electrodes. Using the high-current state 412 as a starting point, some embodiments may provide a partial reset signal to the memory element. For example, a plurality of negative voltage pulses may be successively applied to the memory element to cause the filament 402 to begin to dissipate at the bottom metal electrode.

A first intermediate state in a plurality of intermediate states 414 may correspond to a physical state where the filament 404 has dissipated away from the bottom metal electrode. It has been discovered that this greatly reduces the current of the memory element below that which was illustrated above in FIG. 3 when the partial set signal was used to generate intermediate states. For example, the first intermediate state for filament 404 may have a current of less than 1 µA in the memory element. As successive partial reset signals (e.g., additional negative voltage pulses) are received by the memory element, lesser intermediate states may be entered as filament 406 progressively dissipates from the bottom metal electrode. For example, a second intermediate state corresponding to filament 406 may have a current of approximately 100 nA, and a third intermediate state corresponding to filament 408 may have a current of significantly less than 100 nA. Therefore, starting from a high-current state and gradually dissipating the filament using partial reset signals can generate a plurality of intermediate states that are very current-efficient for large arrays of memory elements. Progressively dissipating the filament, resulting in a progressively widening gap between the remaining filament and the bottom metal electrode results in different intermediate current states with low enough currents that they can be used in non-Von Neumann architectures. The embodiments described herein provide an algorithm to program these intermediate states in a controllable and repeatable fashion to generate intermediate states that are stable enough to be used as actual memory states. Note that this is only one of the many possible physical mechanisms that may be used, and others may also result in similar low-current partial reset states in other embodiments.

Figure 5:
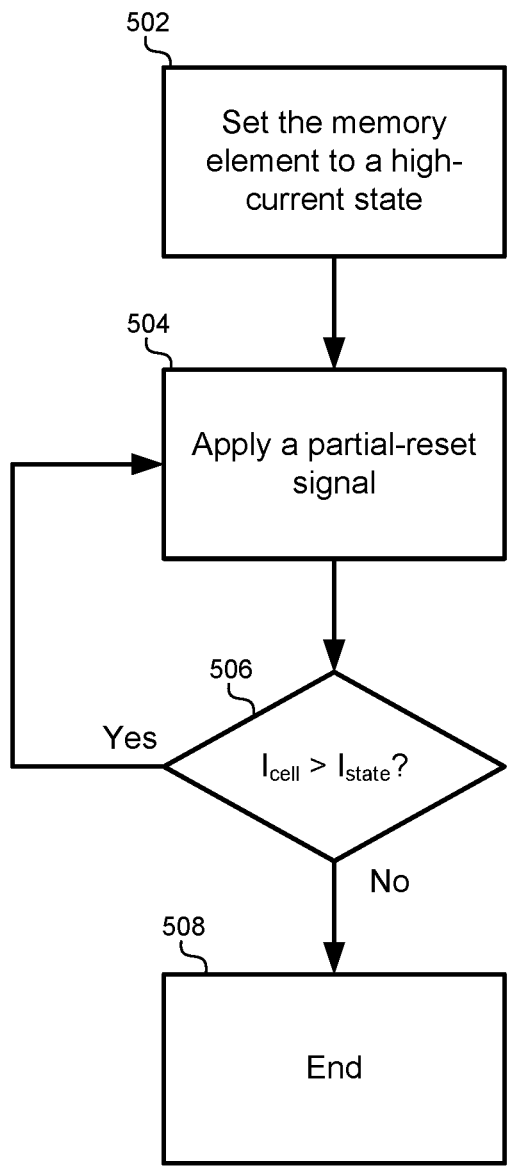
FIG. 5 illustrates a flowchart of a method for setting memory elements into a plurality of intermediate states using partial reset signals, according to some embodiments.

FIG. 5 illustrates a flowchart of a method for setting memory elements into a plurality of intermediate states using partial reset signals, according to some embodiments. The method includes setting the memory element to a high-current state (502). As described above, the high-current state may correspond to a logic 1 or a logic 0, depending on the configuration of the memory element. The memory element may include any type of filamentary memory, such as a ReRAM. The high-current state may correspond to a state in which a filament is completely formed between two metal electrodes in the memory element. In some embodiments, the high-current state may conduct greater than 10 µA of current, although some embodiments may conduct significantly more current, such as approximately 100 µA of current through the memory element. As described above, the memory element may be set to the high-current state by providing one or more set signals comprising one or more voltage pulses. For example, a single pulse may be provided with sufficient magnitude and/or duration to form the filament. Alternatively, a series of voltage pulses may be provided to successively form the filament until it is completely formed. The set signal may comprise a positive voltage applied between a top metal electrode and a bottom metal electrode of the memory element.

The method may also include applying a partial reset signal (504). As described above, a partial reset signal may include one or more voltage pulses that begin to dissipate the filament from the bottom metal electrode without being sufficient to place the memory element entirely in the low-current state. By beginning in the high-current state and providing partial reset signals, this may cause the current in the memory element to drop below approximately 1 µA while still providing distinguishable intermediate memory states. The partial reset signal may comprise a voltage having a magnitude in the opposite direction of the set signal(s). For example, if the set signals use positive voltage pulses, the partial reset signal may use negative voltage pulses.

The method may further include determining whether the state of the memory element corresponds to a predetermined state (506). In some embodiments, a read pulse may be provided to the memory element, and the current through the memory element may be measured. Different intermediate states in the memory element may be distinguished by an amount of current conducted by the memory cell. A comparison may be made between the current conducted through the memory cell ($I_{CELL}$) and a predetermined current ($I_{STATE}$) corresponding to a predetermined state. If the current through the memory cell is still greater than the current of the predetermined state, additional partial reset signals may be applied to the memory cell (504). This process may be continued repeatedly until the predetermined state of the memory cell is reached. As soon as the current through the memory cell is less than or equal to the current corresponding to the predetermined state, the system may stop sending partial reset signals to the memory cell (508).

Figure 6:
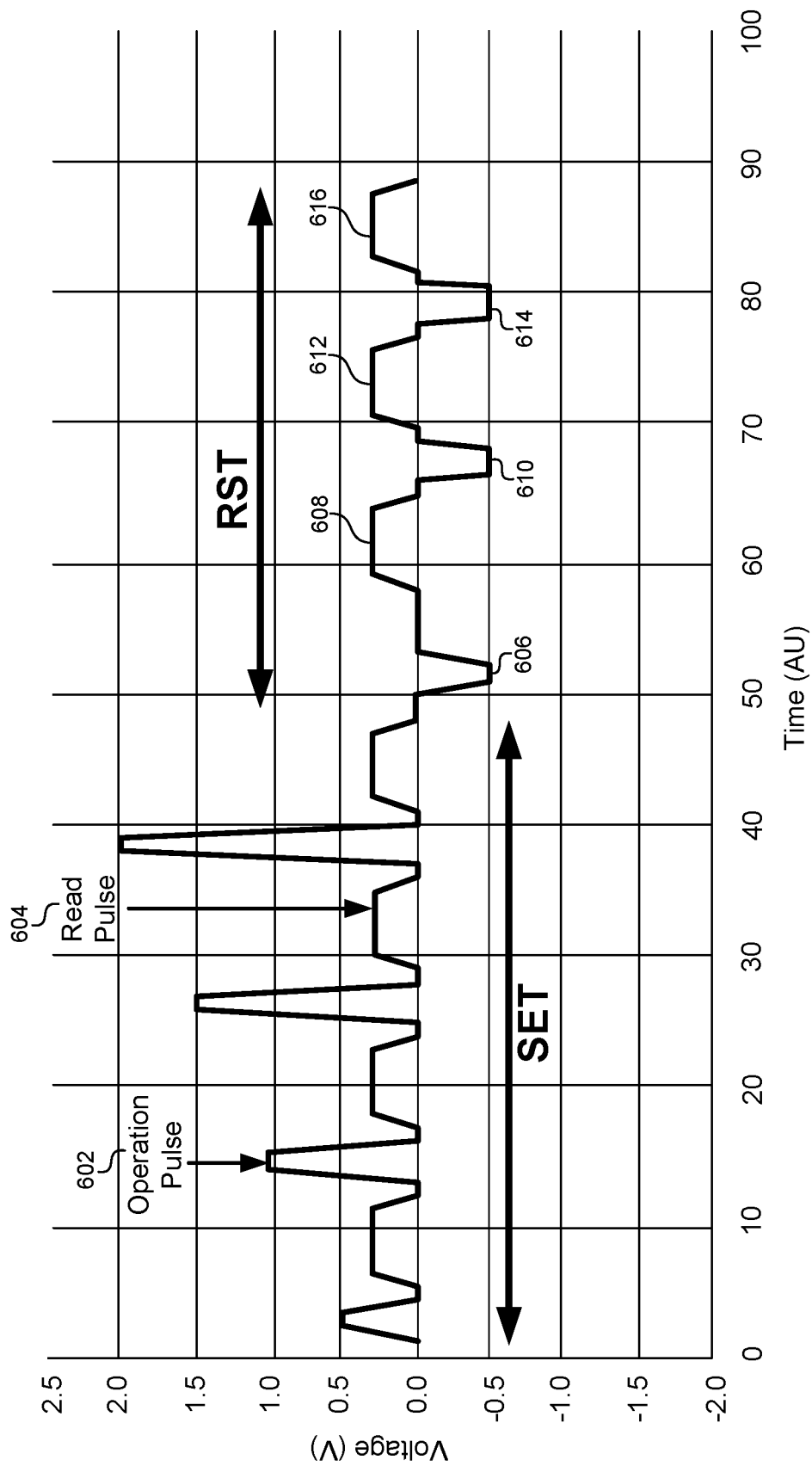
FIG. 6 illustrates a graph of set signals and partial reset signals, according to some embodiments.

FIG. 6 illustrates a graph of set signals and partial reset signals, according to some embodiments. In this embodiment, the set signal may include a plurality of voltage pulses. A first type of voltage pulse may be an operation pulse 602 that is of a magnitude sufficient to increase the size of the filament formed in the memory element. In this example, each successive operation pulse 602 that is part of the set signal may increase in magnitude until the element is fully formed. Between each of the operation pulses 602 one or more read pulses 604 may be executed to measure an amount of current through the memory element. This may allow the memory element to enter a plurality of intermediate states as it moves up to the high-current state. Recall that these intermediate states as part of the set operation may be associated with significantly higher current levels than the intermediate states that are achieved as part of the partial reset operation.

After the memory cell is programmed to a high-current state, the current-efficient intermediate states may be entered by providing a partial reset signal. In this example, the partial reset signals may include a plurality of negative voltage pulses 606, 610, 614 that gradually dissipate the filament from the bottom electrode. By way of example, some embodiments may also include a plurality of read pulses 608, 612, 616 that may be interspersed between the negative voltage pulses 606, 610, 614. As described above in FIG. 5, some embodiments may read the current through the memory cell and compare it to a predetermined current level associated with the predetermined state. If the cell has reached the predetermined current level, then the negative voltage pulses 606, 610, 614 may be discontinued. Alternatively, the negative voltage pulses 606, 610, 614 may be continued until the predetermined current level is reached.

In this example, each of the negative voltage pulses 606, 610, 614 may have approximately the same magnitude and/or width. However, as described in greater detail below, other embodiments may use negative voltage pulses as part of the partial reset signals that gradually increase in magnitude and/or width.

Figure 7:
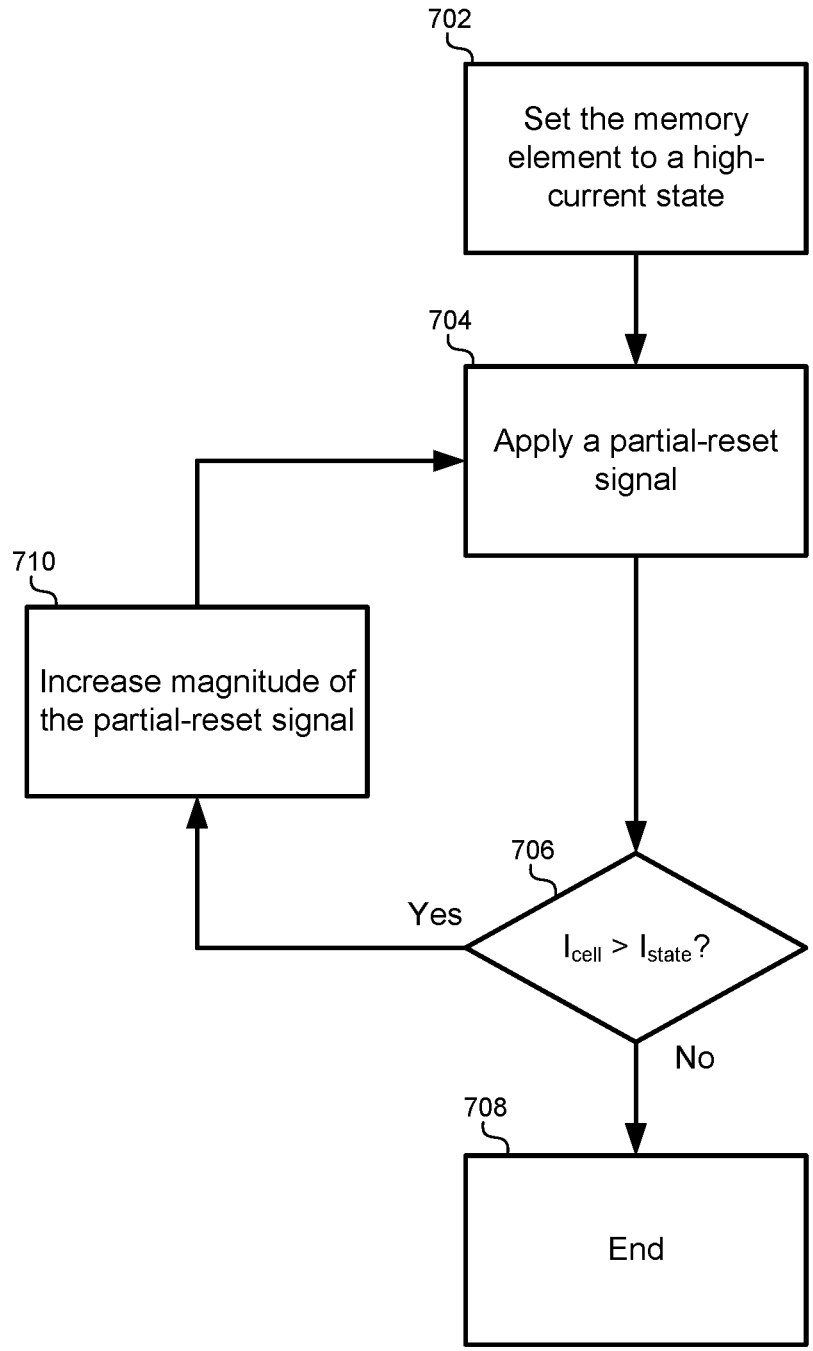
FIG. 7 illustrates a flowchart of a method for entering current-efficient intermediate memory states by increasing the partial reset signals, according to some embodiments.

FIG. 7 illustrates a flowchart of a method for entering current-efficient intermediate memory states by increasing the partial reset signals, according to some embodiments. The method may include setting the memory element to the high-current state (702) and applying a partial reset signal (704) as described above. A read pulse may then be provided to the memory element to test the amount of current through the memory element, which may then be compared to a predetermined current for a predetermined intermediate state (706). If the current is still greater than the predetermined current, then additional partial reset signals may be provided. However, instead of providing partial reset signals of the same magnitude and/or width, some embodiments may increase a magnitude and/or width of the partial reset signals (710) as they are successively applied to the memory element. For example, a magnitude of the partial reset signal may be increased such that a larger negative voltage pulse is applied with each partial reset signal. Additionally or alternatively, the width of the negative voltage pulses may be increased such that more voltage is applied over time. In some embodiments, the rate at which voltage pulses are applied may be increased, and more voltage pulses may be provided between successive read pulses. These embodiments may cause the memory element to transition to the predetermined intermediate state faster than simply providing pulses of the same magnitude, timing, and/or width.

Figure 8:
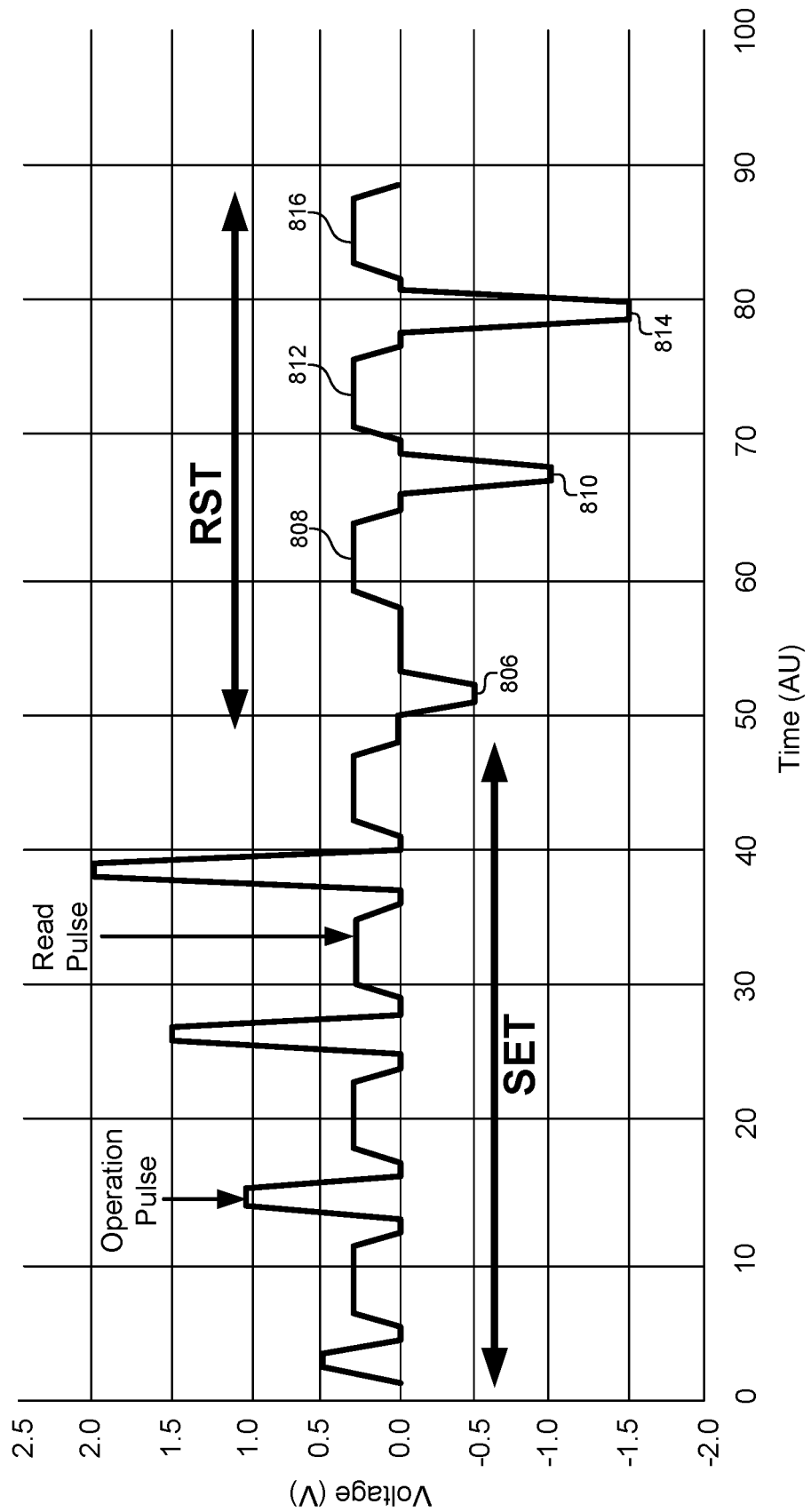
FIG. 8 illustrates a graph of set signals and partial reset signals, according to some embodiments.

FIG. 8 illustrates a graph of set signals and partial reset signals, according to some embodiments. Following the flowchart of FIG. 7, this graph illustrates how the magnitude of the partial reset signals may be increased with each successive signal. For example, negative voltage pulse 810 may have a larger voltage magnitude than a previous negative voltage pulse 806. Similarly, negative voltage pulse 814 may have a larger voltage magnitude than the previous negative voltage pulse 810, and so forth. Although not shown explicitly in FIG. 8, the width of the voltage pulses 806, 810, 814 in the partial reset signals may also be increased, and/or the number of negative voltage pulses may be increased over time such that they are delivered at an increasing rate.

Figure 9:
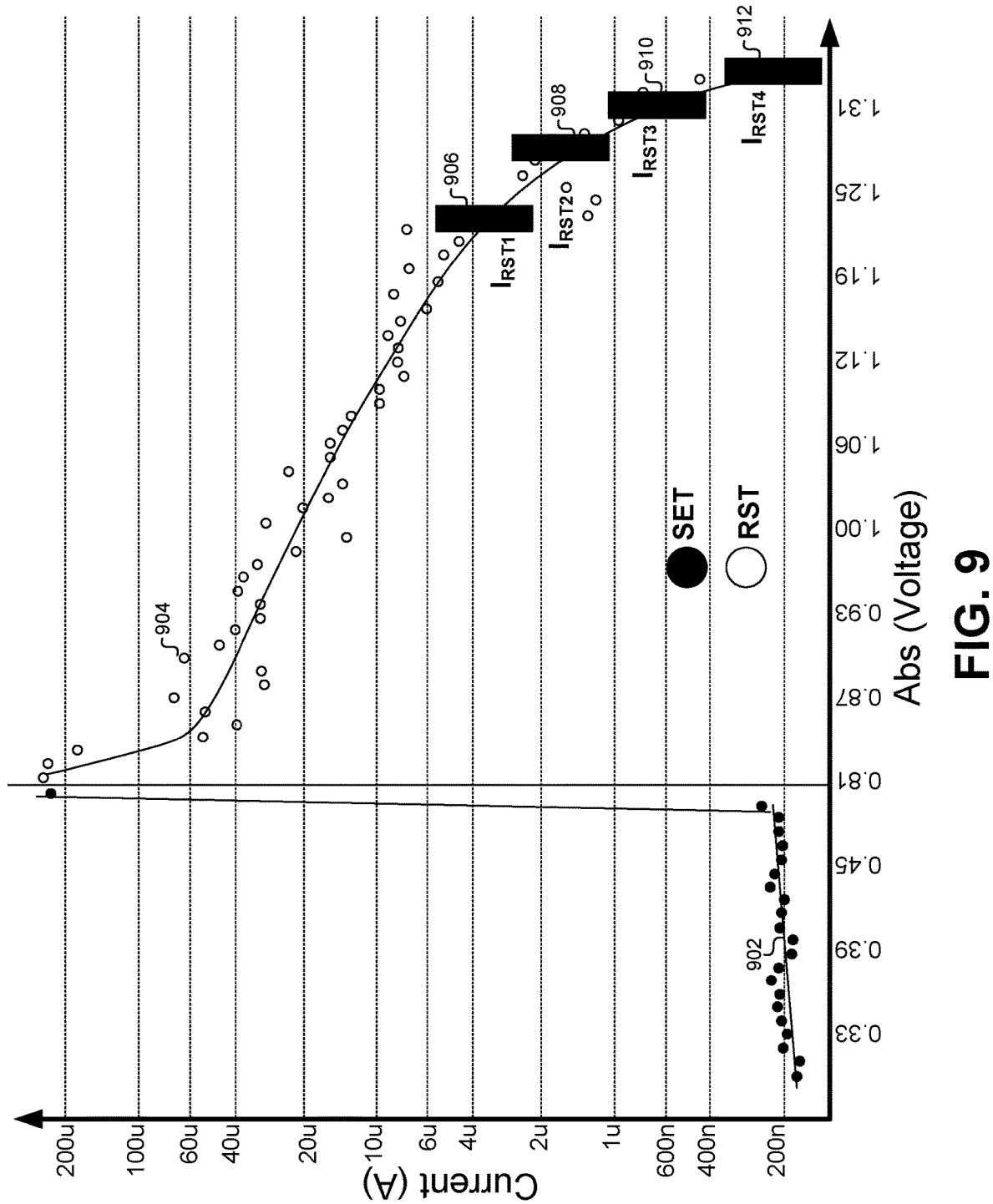
FIG. 9 illustrates a voltage-versus-current curve for set and partial reset operations to achieve multiple intermediate states in a current-efficient manner, according to some embodiments.

FIG. 9 illustrates a voltage-versus-current curve for set and partial reset operations to achieve multiple intermediate states in a current-efficient manner, according to some embodiments. Initially, a set signal 902 comprised of a plurality of positive voltage pulses may be applied to the memory element to transition from the low-current state to the high-current state. Notice that when the set signal 902 reaches a threshold number of pulses or a threshold voltage magnitude, the jump between the low-current state and the high-current state is very abrupt. This makes it difficult to use intermediate states between the low-current state and the high-current state using partial set operations.

After reaching the high-current state, a plurality of partial reset signals comprising, for example, negative voltage pulses may be applied to the memory element. Notice that the drop in current with each successive partial reset signal is much more gradual than the abrupt change generated by the set signal. This allows for a wider distribution of minimally overlapping intermediate states to be achieved during the partial reset operation. Additionally, this allows the memory element to reduce the length of the filament gradually until the current level for the intermediate states reaches a very current-efficient level. In this example, first intermediate state 906 may exist between 6 μA and 2 μA of current. A second intermediate state 908 may exist between approximately 3 μA and 1 μA of current. Additional intermediate states 910, 912 may exist at current levels below 1 μA.

In this example, the intermediate states 906, 908, 910, 912 may slightly overlap in range for some of the intermediate states. However, the different current states have enough non-overlapping space such that some embodiments may provide more than 16 levels of intermediate current states that are low enough to be used in non-Von Neumann architectures with a very high dynamic range (e.g., greater than 100×). These embodiments have also shown good retention at both room-temperature and high-temperature testing environments.

Figure 10:
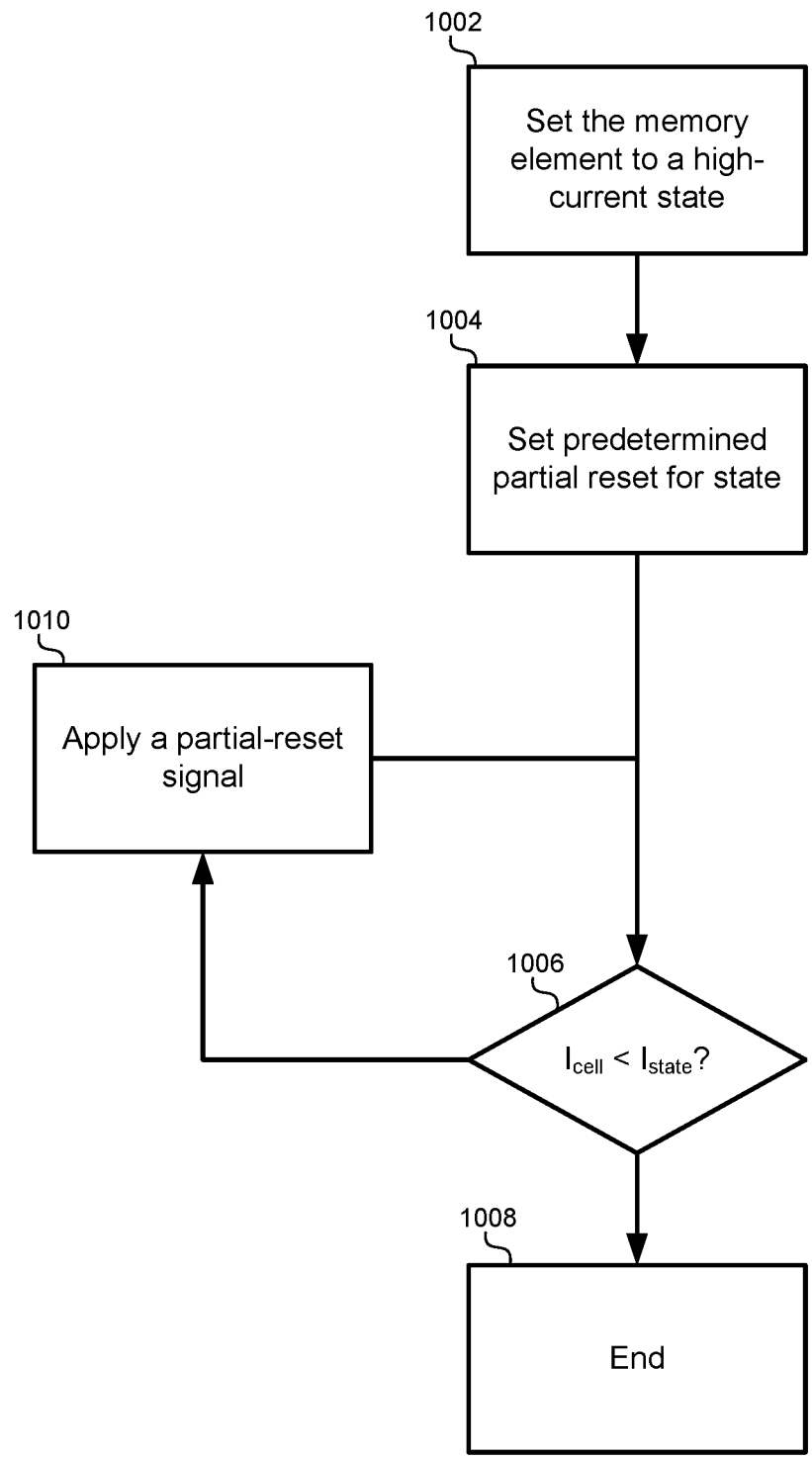
FIG. 10 illustrates a flowchart for a method of using predetermined partial reset signals to repeatedly enter a predetermined intermediate state.

FIG. 10 illustrates a flowchart for a method of using predetermined partial reset signals to repeatedly enter a predetermined intermediate state. The process for manufacturing memory elements may be highly repeatable and predictable, such that many different memory elements manufactured through the same process exhibit similar electrical characteristics when partial reset signals are applied. Through a testing process, the methods of FIG. 5 and FIG. 7 may be used to count the number and/or magnitude of partial reset signals that need to be applied to achieve a predetermined intermediate state. Once a predetermined partial reset signal is determined, this partial reset signal may be initially applied to enter the corresponding state. This may eliminate the need to repeatedly test and incrementally apply partial reset signals to gradually find the predetermined state.

The method may include setting the memory element to a high-current state (1002) as described above. The method may also include setting a predetermined partial reset for a predetermined state (1004). The predetermined partial reset signal may have been previously determined through a testing and/or characterization process for this type of memory element. For example, a predetermined number of negative voltage pulses may be applied. In another example, a single negative voltage pulse having a predetermined width and/or magnitude may be applied. This may have the effect of dissipating the filament a predetermined amount to correspond to a current level for a desired predetermined state.

In some embodiments, the predetermined partial reset signal may set the current state precisely to correspond with the predetermined state. This may be done accurately enough that some embodiments do not need to test the current through the memory element to ensure that the predetermined state was entered. In other embodiments, the system may perform a test to ensure that the predetermined partial reset signal accurately placed the memory element in the correct current state. In some embodiments, the predetermined partial reset signal may be sufficient to lower the current level to a region just above the current level for the corresponding state. This allows for small variations in process and/or material for the memory element that may affect the absolute current levels. By applying a predetermined partial reset signal that is configured to lower the current to still be just above the desired current level, this algorithm can account for material/process differences between memory elements without overshooting the desired current state. The method may then include measuring the current through the memory element and comparing the current to a desired current range for the corresponding state (1006). As described above, if the current level is still above the current level for the corresponding state, the algorithm may apply additional partial reset signals to the memory element (1010) until current range of the corresponding state is reached (1008).

Figure 11:
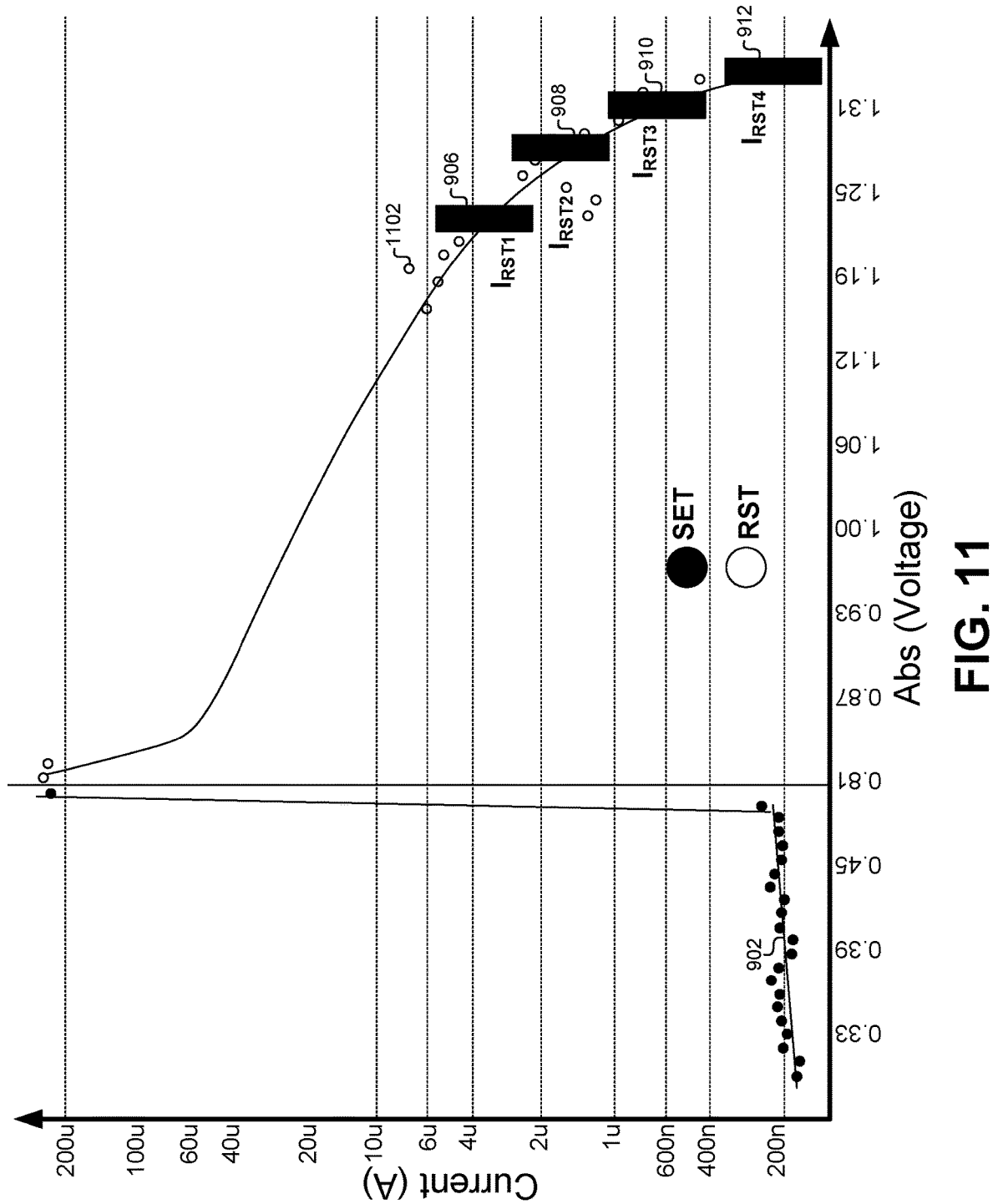
FIG. 11 illustrates a graph that applies a predetermined partial reset signal to the memory element to initially lower the current level to slightly above the desired current level of a corresponding state according to some embodiments.

FIG. 11 illustrates a graph that applies a predetermined partial reset signal to the memory element to initially lower the current level to slightly above the desired current level of a corresponding state according to some embodiments. As described above in FIG. 9, the memory element may begin in the high-current state and received partial reset signals to transition down to intermediate current-efficient states. Instead of applying multiple voltage pulses and measuring the current level after each pulse, embodiments described above in FIG. 10 may instead apply a predetermined partial reset signal comprised of one or more negative voltage pulses to lower the current level to a threshold 1102 above (e.g., within 2 μA above) the desired state 906. Then, additional partial reset signals can be applied until the measured current level falls within the current range of the desired state 906.

Figure 12:
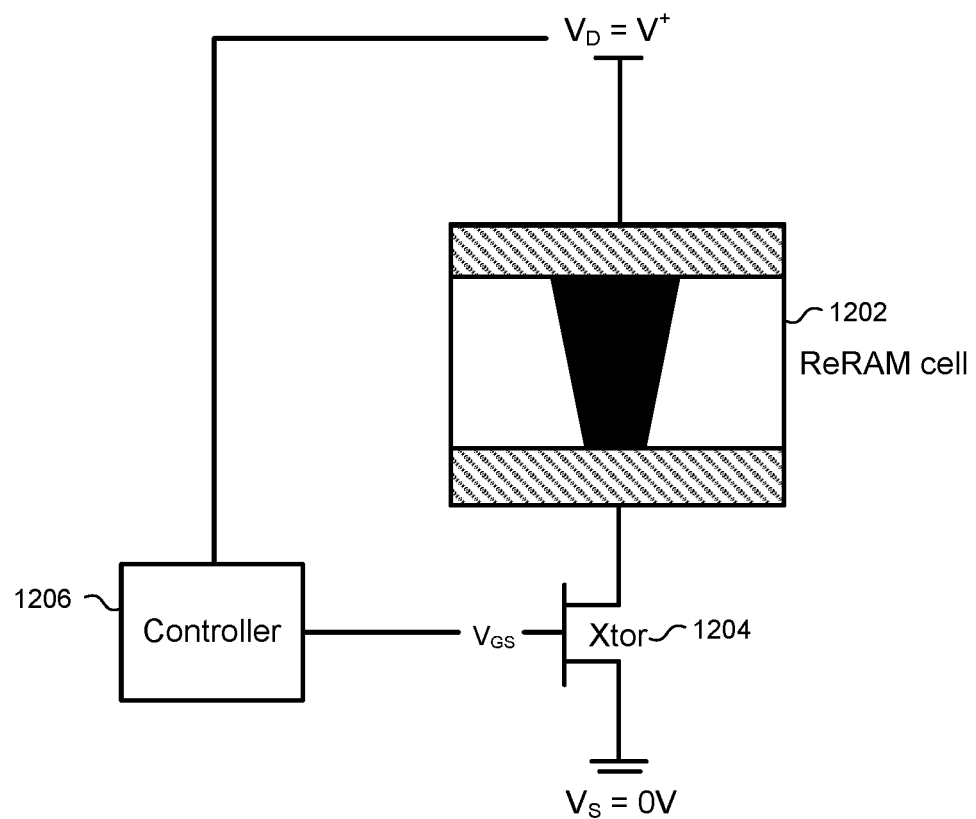
FIG. 12 illustrates an example circuit of a memory cell, according to some embodiments.

FIG. 12 illustrates an example circuit of a memory cell, according to some embodiments. A memory cell may include a transistor 1204 and a memory element 1202. Some embodiments may also include a voltage control circuit 1206 that is configured to generate voltages to be applied to various inputs of the memory cell. For example, the voltage control circuit 1206 may provide varying voltages to the top metal electrode of the memory cell 1202 and/or the drain of the transistor 1204. In some embodiments, the voltage control circuit 1206 may additionally or alternatively provide voltages to a gate of the transistor 1204. The current through the memory element 1202 may be controlled by the drain voltage and/or by the gate voltage of the transistor 1204. Therefore, the partial reset signals described above may be implemented by providing voltage pulses to the drain voltage, or by adjusting the voltage applied to the gate of the transistor 1204. Either method may be used interchangeably in any of the embodiments described herein.

The voltage control circuit 1206 may be implemented by a microcontroller with a timing circuit configured to generate periodic outputs through a buffer to generate voltage pulses to be applied to the memory cell. The voltage control circuit 1206 may also be implemented through discrete timing circuits that generate read/write pulses as part of a control circuit for a memory array.

Figure 13:
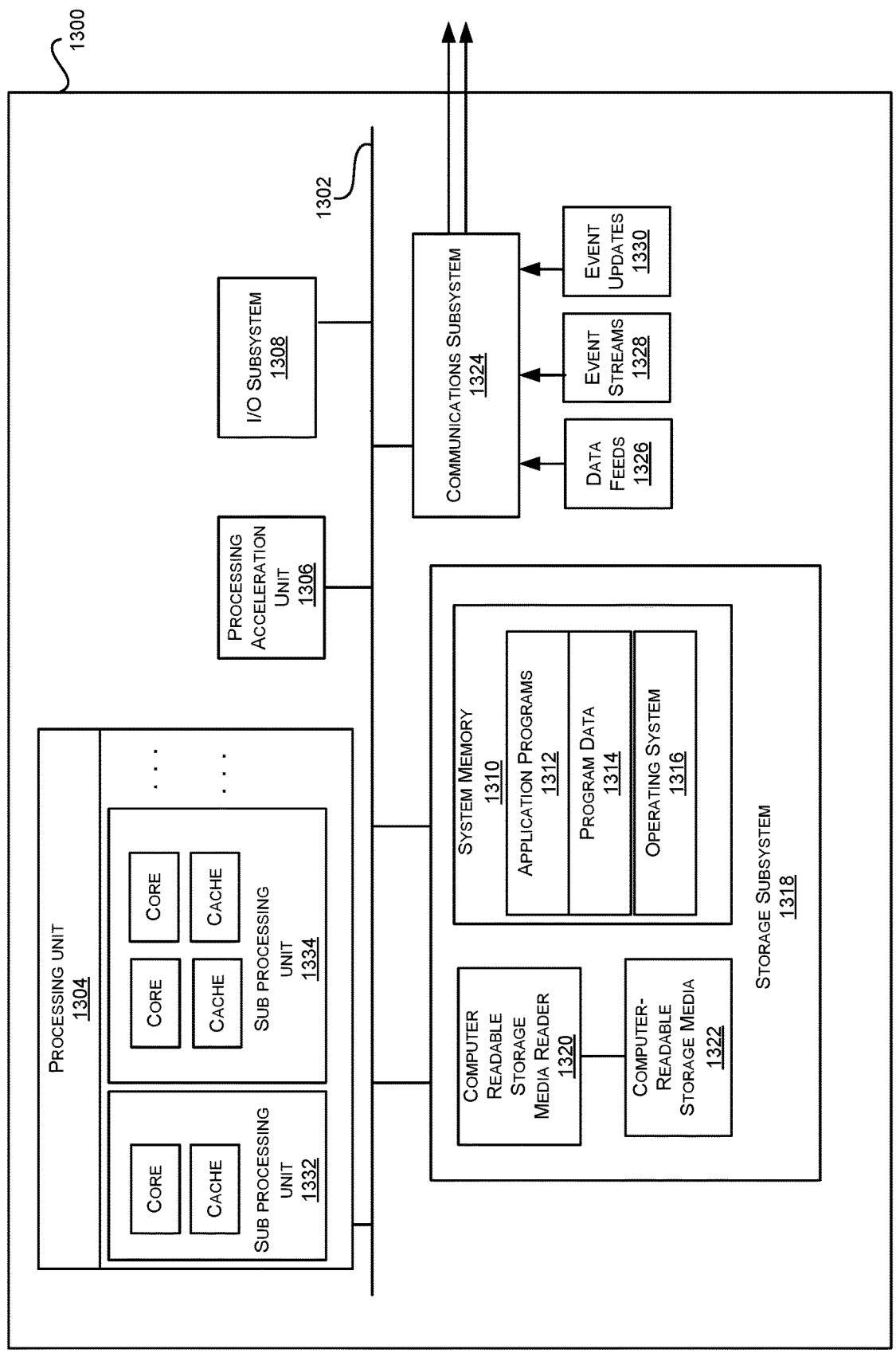
FIG. 13 illustrates an exemplary computer system 1300, in which various embodiments may be implemented.

Some embodiments may use a computer system to generate voltage pulses, read current levels on the memory element, and/or test memory elements to determine predetermined partial reset signals that may be applied to enter a plurality of predetermined intermediate current states. FIG. 13 illustrates an exemplary computer system 1300, in which various embodiments may be implemented. As shown in the figure, computer system 1300 includes a processing unit 1304 that communicates with a number of peripheral subsystems via a bus subsystem 1302. These peripheral subsystems may include a processing acceleration unit 1306, an I/O subsystem 1308, a storage subsystem 1318 and a communications subsystem 1324. Storage subsystem 1318 includes tangible computer-readable storage media 1322 and a system memory 1310.

Bus subsystem 1302 provides a mechanism for letting the various components and subsystems of computer system 1300 communicate with each other as intended. Although bus subsystem 1302 is shown schematically as a single bus, alternative embodiments of the bus subsystem may utilize multiple buses. Bus subsystem 1302 may be any of several types of bus structures including a memory bus or memory controller, a peripheral bus, and a local bus using any of a variety of bus architectures. For example, such architectures may include an Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus, which can be implemented as a Mezzanine bus manufactured to the IEEE P1386.1 standard.

Processing unit 1304, which can be implemented as one or more integrated circuits (e.g., a conventional microprocessor or microcontroller), controls the operation of computer system 1300. One or more processors may be included in processing unit 1304. These processors may include single core or multicore processors. In certain embodiments, processing unit 1304 may be implemented as one or more independent processing units 1332 and/or 1334 with single or multicore processors included in each processing unit. In other embodiments, processing unit 1304 may also be implemented as a quad-core processing unit formed by integrating two dual-core processors into a single chip.

In various embodiments, processing unit 1304 can execute a variety of programs in response to program code and can maintain multiple concurrently executing programs or processes. At any given time, some or all of the program code to be executed can be resident in processor(s) 1304 and/or in storage subsystem 1318. Through suitable programming, processor(s) 1304 can provide various functionalities described above. Computer system 1300 may additionally include a processing acceleration unit 1306, which can include a digital signal processor (DSP), a special-purpose processor, and/or the like.

I/O subsystem 1308 may include user interface input devices and user interface output devices. User interface input devices may include a keyboard, pointing devices such as a mouse or trackball, a touchpad or touch screen incorporated into a display, a scroll wheel, a click wheel, a dial, a button, a switch, a keypad, audio input devices with voice command recognition systems, microphones, and other types of input devices. User interface input devices may include, for example, motion sensing and/or gesture recognition devices such as the Microsoft Kinect® motion sensor that enables users to control and interact with an input device, such as the Microsoft Xbox® 360 game controller, through a natural user interface using gestures and spoken commands. User interface input devices may also include eye gesture recognition devices such as the Google Glass® blink detector that detects eye activity (e.g., 'blinking' while taking pictures and/or making a menu selection) from users and transforms the eye gestures as input into an input device (e.g., Google Glass®). Additionally, user interface input devices may include voice recognition sensing devices that enable users to interact with voice recognition systems (e.g., Siri® navigator), through voice commands.

User interface input devices may also include, without limitation, three dimensional (3D) mice, joysticks or pointing sticks, gamepads and graphic tablets, and audio/visual devices such as speakers, digital cameras, digital camcorders, portable media players, webcams, image scanners, fingerprint scanners, barcode reader 3D scanners, 3D printers, laser rangefinders, and eye gaze tracking devices. Additionally, user interface input devices may include, for example, medical imaging input devices such as computed tomography, magnetic resonance imaging, position emission tomography, medical ultrasonography devices. User interface input devices may also include, for example, audio input devices such as MIDI keyboards, digital musical instruments and the like.

User interface output devices may include a display subsystem, indicator lights, or non-visual displays such as audio output devices, etc. The display subsystem may be a cathode ray tube (CRT), a flat-panel device, such as that using a liquid crystal display (LCD) or plasma display, a projection device, a touch screen, and the like. In general, use of the term "output device" is intended to include all possible types of devices and mechanisms for outputting information from computer system 1300 to a user or other computer. For example, user interface output devices may include, without limitation, a variety of display devices that visually convey text, graphics and audio/video information such as monitors, printers, speakers, headphones, automotive navigation systems, plotters, voice output devices, and modems.

Computer system 1300 may comprise a storage subsystem 1318 that comprises software elements, shown as being currently located within a system memory 1310. System memory 1310 may store program instructions that are loadable and executable on processing unit 1304, as well as data generated during the execution of these programs.

Depending on the configuration and type of computer system 1300, system memory 1310 may be volatile (such as random access memory (RAM)) and/or non-volatile (such as read-only memory (ROM), flash memory, etc.) The RAM typically contains data and/or program modules that are immediately accessible to and/or presently being operated and executed by processing unit 1304. In some implementations, system memory 1310 may include multiple different types of memory, such as static random access memory (SRAM) or dynamic random access memory (DRAM). In some implementations, a basic input/output system (BIOS), containing the basic routines that help to transfer information between elements within computer system 1300, such as during start-up, may typically be stored in the ROM. By way of example, and not limitation, system memory 1310 also illustrates application programs 1312, which may include client applications, Web browsers, mid-tier applications, relational database management systems (RDBMS), etc., program data 1314, and an operating system 1316. By way of example, operating system 1316 may include various versions of Microsoft Windows®, Apple Macintosh®, and/or Linux operating systems, a variety of commercially-available UNIX® or UNIX-like operating systems (including without limitation the variety of GNU/Linux operating systems, the Google Chrome® OS, and the like) and/or mobile operating systems such as iOS, Windows® Phone, Android® OS, BlackBerry® 10 OS, and Palm® OS operating systems.

Storage subsystem 1318 may also provide a tangible computer-readable storage medium for storing the basic programming and data constructs that provide the functionality of some embodiments. Software (programs, code modules, instructions) that when executed by a processor provide the functionality described above may be stored in storage subsystem 1318. These software modules or instructions may be executed by processing unit 1304. Storage subsystem 1318 may also provide a repository for storing data used in accordance with various embodiments.

Storage subsystem 1300 may also include a computer-readable storage media reader 1320 that can further be connected to computer-readable storage media 1322. Together and, optionally, in combination with system memory 1310, computer-readable storage media 1322 may comprehensively represent remote, local, fixed, and/or removable storage devices plus storage media for temporarily and/or more permanently containing, storing, transmitting, and retrieving computer-readable information.

Computer-readable storage media 1322 containing code, or portions of code, can also include any appropriate media known or used in the art, including storage media and communication media, such as but not limited to, volatile and non-volatile, removable and non-removable media implemented in any method or technology for storage and/or transmission of information. This can include tangible computer-readable storage media such as RAM, ROM, electronically erasable programmable ROM (EEPROM), flash memory or other memory technology, CD-ROM, digital versatile disk (DVD), or other optical storage, magnetic cassettes, magnetic tape, magnetic disk storage or other magnetic storage devices, or other tangible computer readable media. This can also include nontangible computer-readable media, such as data signals, data transmissions, or any other medium which can be used to transmit the desired information and which can be accessed by computing system 1300.

By way of example, computer-readable storage media 1322 may include a hard disk drive that reads from or writes to non-removable, nonvolatile magnetic media, a magnetic disk drive that reads from or writes to a removable, non-volatile magnetic disk, and an optical disk drive that reads from or writes to a removable, nonvolatile optical disk such as a CD ROM, DVD, and Blu-Ray® disk, or other optical media. Computer-readable storage media 1322 may include, but is not limited to, Zip® drives, flash memory cards, universal serial bus (USB) flash drives, secure digital (SD) cards, DVD disks, digital video tape, and the like. Computer-readable storage media 1322 may also include, solid-state drives (SSD) based on non-volatile memory such as flash-memory based SSDs, enterprise flash drives, solid state ROM, and the like, SSDs based on volatile memory such as solid state RAM, dynamic RAM, static RAM, DRAM-based SSDs, magnetoresistive RAM (MRAM) SSDs, and hybrid SSDs that use a combination of DRAM and flash memory based SSDs. The disk drives and their associated computer-readable media may provide non-volatile storage of computer-readable instructions, data structures, program modules, and other data for computer system 1300.

Communications subsystem 1324 provides an interface to other computer systems and networks. Communications subsystem 1324 serves as an interface for receiving data from and transmitting data to other systems from computer system 1300. For example, communications subsystem 1324 may enable computer system 1300 to connect to one or more devices via the Internet. In some embodiments communications subsystem 1324 can include radio frequency (RF) transceiver components for accessing wireless voice and/or data networks (e.g., using cellular telephone technology, advanced data network technology, such as 3G, 4G or EDGE (enhanced data rates for global evolution), WiFi (IEEE 802.11 family standards, or other mobile communication technologies, or any combination thereof), global positioning system (GPS) receiver components, and/or other components. In some embodiments communications subsystem 1324 can provide wired network connectivity (e.g., Ethernet) in addition to or instead of a wireless interface.

In some embodiments, communications subsystem 1324 may also receive input communication in the form of structured and/or unstructured data feeds 1326, event streams 1328, event updates 1330, and the like on behalf of one or more users who may use computer system 1300.

By way of example, communications subsystem 1324 may be configured to receive data feeds 1326 in real-time from users of social networks and/or other communication services such as Twitter® feeds, Facebook® updates, web feeds such as Rich Site Summary (RSS) feeds, and/or real-time updates from one or more third party information sources.

Additionally, communications subsystem 1324 may also be configured to receive data in the form of continuous data streams, which may include event streams 1328 of real-time events and/or event updates 1330, that may be continuous or unbounded in nature with no explicit end. Examples of applications that generate continuous data may include, for example, sensor data applications, financial tickers, network performance measuring tools (e.g. network monitoring and traffic management applications), clickstream analysis tools, automobile traffic monitoring, and the like.

Communications subsystem 1324 may also be configured to output the structured and/or unstructured data feeds 1326, event streams 1328, event updates 1330, and the like to one or more databases that may be in communication with one or more streaming data source computers coupled to computer system 1300.

Computer system 1300 can be one of various types, including a handheld portable device (e.g., an iPhone® cellular phone, an iPad® computing tablet, a PDA), a wearable device (e.g., a Google Glass® head mounted display), a PC, a workstation, a mainframe, a kiosk, a server rack, or any other data processing system.

Due to the ever-changing nature of computers and networks, the description of computer system 1300 depicted in the figure is intended only as a specific example. Many other configurations having more or fewer components than the system depicted in the figure are possible. For example, customized hardware might also be used and/or particular elements might be implemented in hardware, firmware, software (including applets), or a combination. Further, connection to other computing devices, such as network input/output devices, may be employed. Based on the disclosure and teachings provided herein, a person of ordinary skill in the art will appreciate other ways and/or methods to implement the various embodiments.

In the foregoing description, for the purposes of explanation, numerous specific details were set forth in order to provide a thorough understanding of various embodiments. It will be apparent, however, to one skilled in the art that embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of the exemplary embodiments will provide those skilled in the art with an enabling description for implementing an exemplary embodiment. It should be understood that various changes may be made in the function and arrangement of elements without departing from the spirit and scope of various embodiments as set forth in the appended claims.

Specific details are given in the foregoing description to provide a thorough understanding of the embodiments. However, it will be understood by one of ordinary skill in the art that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, aspects of various embodiments are described with reference to specific embodiments thereof, but those skilled in the art will recognize that not all embodiments are limited thereto. Various features and aspects of the above-described embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMs, EPROMs, EEPROMs, magnetic or optical cards, flash memory, or other types of machine-readable mediums suitable for storing electronic instructions. Alternatively, the methods may be performed by a combination of hardware and software.

What is claimed is:

1. A method for setting memory elements in a plurality of states-, the method comprising:
    applying a set signal to a memory element to transition the memory element from a low-current state to a high-current state;
    applying a partial reset signal to the memory element to transition the memory element from the high-current state to a state between the high-current state and the low-current state;
    determining whether the state corresponds to a predetermined state; and
    applying one or more additional partial reset signals to the memory element until the state corresponds to the predetermined current state.

2. The method of claim 1, wherein:
    the low-current state corresponds to a logic 0; and
    the high-current state corresponds to a logic 1.

3. The method of claim 1, wherein the memory element comprises a filamentary Random Access Memory (RAM).

4. The method of claim 3, wherein the filamentary RAM comprises a resistive RAM (ReRAM).

5. The method of claim 1, wherein the memory element is part of a non-Von Neumann architecture.

6. The method of claim 1, wherein the state corresponds to a current level of less than 1 µA through the memory element.

7. The method of claim 6, wherein the high-current state corresponds to a current level of approximately 100 µA through the memory element.

8. The method of claim 1, wherein the state is one of a plurality of intermediate states between the high-current state and the low-current state.

9. The method of claim 8, wherein the plurality of intermediate states comprises at least three intermediate states, each having a non-overlapping current range between 10 nA and 1 µA.

10. The method of claim 8, wherein each of the plurality of intermediate states corresponds to a different tunneling barrier length in the memory element.

11. The method of claim 10, wherein a width of a filament in the memory element is approximately the same for each of the plurality of intermediate states.

* * * * *